United States Patent
Park

(10) Patent No.: US 6,561,666 B2
(45) Date of Patent: May 13, 2003

(54) ORGANIC ELECTROLUMINESCENT (EL) DEVICE

(75) Inventor: Eui Yeul Park, Suwon (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 09/850,406

(22) Filed: May 8, 2001

(65) Prior Publication Data

US 2002/0044441 A1 Apr. 18, 2002

(30) Foreign Application Priority Data

Oct. 6, 2000 (KR) .................................. 2000-58741

(51) Int. Cl.[7] ................................................ F21V 9/16
(52) U.S. Cl. .......................... 362/84; 313/504; 313/512; 257/433
(58) Field of Search ............................ 362/84; 313/504, 313/512; 257/433

(56) References Cited

U.S. PATENT DOCUMENTS 5,703,394 A * 12/1997 Wei et al. .................... 257/433
6,284,342 B1 * 9/2001 Ebisawa et al. ............. 313/512

* cited by examiner

*Primary Examiner*—Stephen Husar
(74) *Attorney, Agent, or Firm*—Staas & Halsey LLP

(57) ABSTRACT

An organic electroluminescent (EL) device includes a first electrode, a second electrode, an electroluminescent (EL) light-emitting layer, and a printed circuit board. The first electrode is formed on a transparent substrate. The second electrode spaced is apart from the first electrode and applies an electric current to the organic EL device together with the first electrode. The EL light-emitting layer is interposed between the first and second electrodes. The printed circuit board has a multi-layered structure and is attached to the first electrode to cover the EL light-emitting layer.

20 Claims, 2 Drawing Sheets

ORGANIC ELECTROLUMINESCENT (EL) DEVICE

CROSS REFERENCE TO RELATED APPLICATIONS

This application claims the benefit of Korean Patent Application No. 2000-58741, filed on Oct. 6, 2000, under 35 U.S.C. § 119, the entirety of which is hereby incorporated by reference.

BACKGROUND OF THE INVENTION

1. Field of the Invention

The present invention relates to an organic [EL] electroluminescent (or EL) device, and, more particularly, to an organic electroluminescent device having a multilayer printed circuit board.

2. Description of Related Art

FIG. 1 is a cross sectional view illustrating a configuration of a conventional organic EL device 5. As shown in FIG. 1, the conventional EL device 5 includes a first electrode or anode electrode 11 formed on a substrate 10, and a second electrode or cathode electrode 17 with an EL light-emitting layer 12 interposed therebetween. Preferably, the anode electrode 11 is made of a transparent material such as indium tin oxide (ITO), and the cathode electrode 17 is made of Al, Mg, Ag, Ca, or Ba, or the like.

The EL light-emitting layer 12 includes a hole transport layer, a luminescent layer, and an electron transport layer. A metal layer 15 is formed to protect the EL light-emitting layer 12 from humidity, oxygen, and an external impact. The metal layer 15 is fixed to the anode electrode 11 by an adhesive 16. The metal layer 15 has a hygroscopic agent 14 in the form of a powder in space formed by a filter 13. The filter 13 merely serves to prevent the hygroscopic agent 14 from leaking out the space formed by the filter 13 and the metal layer 15. Therefore, when the hygroscopic agent 14 is attached to an inner surface of the metal layer 15 by a predetermined method, the filter 13 may be removed.

However, in the conventional EL device 5 having such a configuration, since a printed circuit board having components to drive the EL device 5 should be separately disposed, a problem arise in that the volume or size of the device 5 increases, leading to an undesirable appearance. More particularly, because of the above-mentioned problem with the conventional device 5, it is difficult to obtain a compact organic EL device.

In efforts to protect the organic EL light-emitting layer 12 from humidity or oxygen, a multi-layered structure in which a metal layer and a resin layer are repeatedly coated is suggested. However, the organic EL device of such a structure has further problems in that processing time is long and production cost is high.

SUMMARY OF THE INVENTION

To overcome the problems described above, preferred embodiments of the present invention provide a compact organic EL electroluminescent (or EL) device.

It is another object of the present invention to provide a compact El device.

It is another abject of the present invention is to provide an organic EL device having a short processing time.

It is also another abject of the present invention is to provide an organic EL device having a low production cost.

In order to achieve the above-mentioned objects, the present invention comprises an organic EL device comprising a first electrode, a second electrode, an EL light-emitting layer, and a printed circuit board. In the EL device of the present invention, the first electrode is formed on a transparent substrate. The second electrode is spaced apart from the first electrode and together with the first electrode applies an electric current to the organic EL device. The EL light-emitting layer is interposed between the first and second electrodes. The printed circuit board or a flexible printed circuit board include a multi-layered structure and is attached to the first electrode to cover the EL light-emitting layer.

The organic EL device of the present invention further includes a hygroscopic agent attached to a bottom surface of the printed circuit board or the flexible printed circuit board. The printed circuit board or the flexible printed circuit board includes metal layers and a resin layer. The metal included in the metal layers is a low resistance metal such as Cu, Ag, Au, or Ni or their alloy. The metal layers of the printed circuit board or the flexible printed circuit board are connected with the first and second electrodes via an anithotropic conductive film (ACF). The printed circuit board or the flexible printed circuit board includes a drive intergrated circuit (IC). The drive IC is connected with the first and second electrodes via one of a chip on board (COB), a tape automated bonding (TAB), and a chip on glass (COG). The printed circuit board or the flexible printed circuit board is attached to the first electrode via an adhesive.

The organic EL device according to the preferred embodiment of the present invention has the following advantages. Firstly, since the printed circuit board or the flexible printed circuit board of the multi-layered structure serves to protect the EL light-emitting layer from humidity, oxygen, external impact, and the like, a compact organic EL device can be obtained. Secondly, instead of using the metal layer according to the conventional art, the printed circuit board or the flexible printed circuit board having a multi-layered structure which is in common use is used, and, thus, the manufacturing process is simple, and the processing time is short. Thirdly, a production cost is low.

BRIEF DESCRIPTION OF THE DRAWINGS

These and other object and advantages of the invention will become apparent and more readily appreciated from the following description of the preferred embodiments, taken in conjunction with the accompanying drawings of which.

DETAILED DESCRIPTION OF THE EMBODIMENTS

Reference will now be made in detail to an embodiment of the present invention, example of which is illustrated in the accompanying drawing[s].

Figure 2:
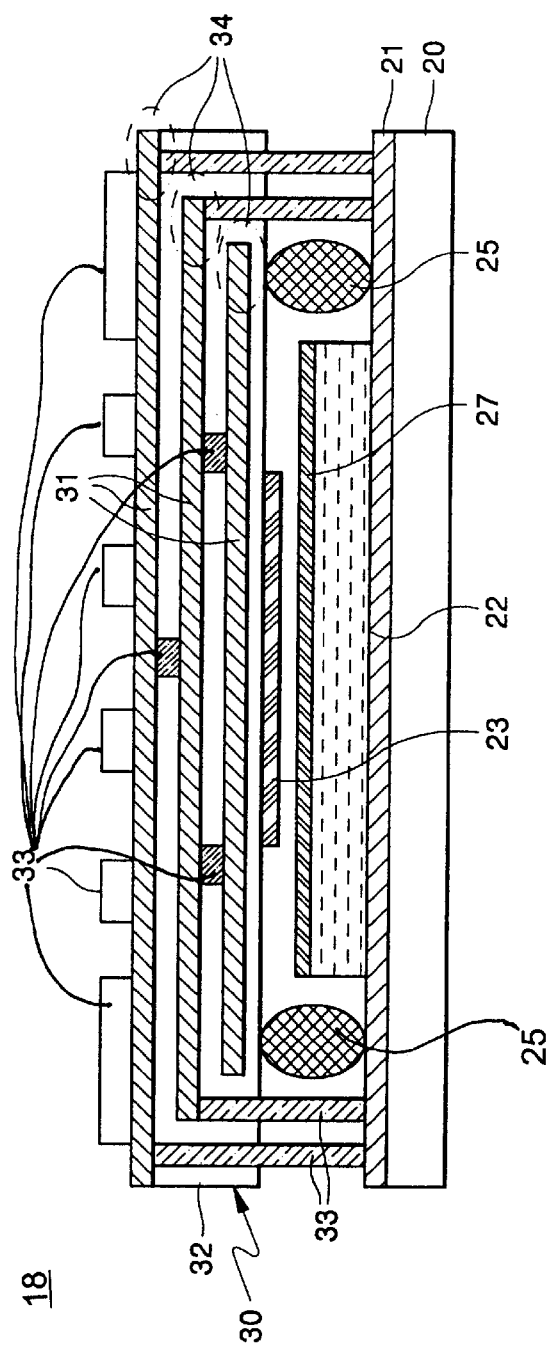
FIG. 2 is a cross-sectional view illustrating an organic EL device according to a an embodiment of the present invention.

FIG. 2 shows an organic electroluminescent (EL) device 18 according to the preferred embodiment of the present invention. As shown in FIG. 2, the organic EL device 18 includes a first electrode or anode electrode 21 formed on a substrate 20 and a second electrode or cathode electrode 27 with an electroluminescent (EL) light-emitting layer 22 interposed therebetween. Preferably, the anode electrode 21 is made of a transparent material such as indium tin oxide (ITO), and the cathode electrode 27 is made of Al, Mg, Ag, Ca, or Ba, or the like. The EL light-emitting layer 22 includes a hole transport layer, a luminescent layer, and an electron transport layer. A printed circuit board (PCB) or a flexible printed circuit board 30 of a multi-layered structure (that is, a multi-layer board) is disposed to protect the EL light-emitting layer 22 from humidity, oxygen, external impact, and the like. A hygroscopic agent 23 is attached to a bottom surface of the printed circuit board or the flexible printed circuit board 30 to remove humidity, oxygen and the like. A sealant 25 is disposed as part of the electroluminescent (EL) device 18 to ensure a gap between the printed circuit board or the flexible printed circuit board 30 and the anode electrode 21 and to connect the anode electrode 21 with the printed circuit board or the flexible printed circuit board 30.

At this point, the printed circuit board or the flexible printed circuit board 30 includes metal layers 31, a resin layer 32, and circuit components 33 such as a drive integrated circuit (IC) to drive the organic EL device 18. The metal layer 31 is made of a low resistance metal such as Cu, Cr, Ag, Au, or Ni or their alloy. The drive IC is connected to the anode and cathode electrodes 21 and 27 through pad portions 34 of the metal layers 31 by various well-known techniques. For example, a technique for connecting the drive IC with the anode and cathode electrodes 21 and 27 includes a chip on board (COB), a tape automated bonding (TAB), and a chip on glass (COG). Further, the pad portions 34 of the metal layers 31 may be directly connected with an anisotropic conductive film (ACF). In this case, the pad portions 34 include a plurality of fine patterns. It is relatively easy to form a plurality of the fine patterns with the printed circuit board or the flexible printed circuit board 30 having the multi-layered structure, while it is very difficult to form a plurality of the fine patterns within the printed circuit board or the flexible printed circuit board having a single layered structure. As a result, electrode lines 33 on the different metal layers 31 are disposed to differ in height, and therefore a pitch between adjacent two fine patterns on the same metal layer becomes relatively wide, leading to a compact line arrangement.

Figure 1:
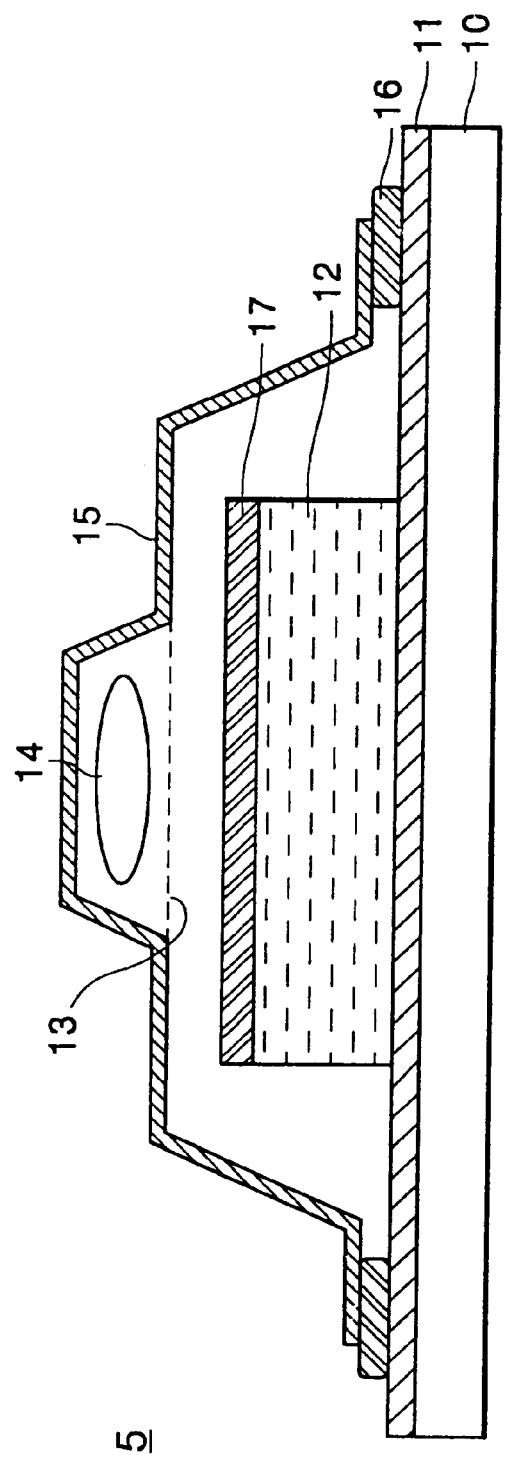
FIG. 1 is a cross-sectional view illustrating a conventional organic EL device.

As described herein before, the organic EL device 18 according to the embodiment of the present invention has the following advantages. Since the printed circuit board or the flexible printed circuit board 30 of the multi-layered structure serves to protect the EL light-emitting layer 22 from humidity, oxygen, external impact, and the like, a compact organic EL device 18 can be obtained. Instead of the metal layer 15 of FIG. 1, the printed circuit board or the flexible printed circuit board 30 of the multi-layered structure which is in common use is used, the manufacturing process is simple, and the processing time is short. Moreover, production cost is low.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An organic EL device, comprising:
   a first electrode formed on a transparent substrate;
   a second electrode spaced apart from the first electrode and applying an electric current to the organic EL device together with the first electrode;
   an EL light-emitting layer interposed between the first and second electrodes;
   a printed circuit board having a multi-layered structure and attached to the first electrode and covering the EL light-emitting layer; and
   a hygroscopic agent attached to the bottom surface of the printed circuit board.

2. The device of claim 1, wherein the hygroscopic agent is provided between the second electrode and the printed circuit board.

3. The device of claim 1, wherein the printed circuit board includes metal layers and a resin layer.

4. The device of claim 3, wherein the metal layers comprise a low resistance metal.

5. The device of claim 3, wherein the metal layers of the printed circuit board are connected to the first and second electrodes via an anithotropic conductive film (ACF).

6. The device of claim 1, wherein the printed circuit board includes a drive intergrated circuit (IC), the drive IC being connected to the first and second electrodes via one of a chip on board (COB), a tape automated bonding (TAB), and a chip on glass (COG).

7. The device of claim 1, wherein the printed circuit board is attached to the anode electrode via an adhesive.

8. The device of claim 4, wherein the metal layers is made of Cu, Cr, Ag, Au, or Ni or their alloy.

9. An apparatus comprising:
   an electroluminescent light-emitting layer;
   electrodes provided on respective sides of the electroluminescent light-emitting layer and applying an electric current to the apparatus;
   a multilayer board attached to one of the electrodes and covering the electroluminescent light-emitting layer; and
   a hygroscopic agent attached to a bottom surface of the multilayer board.

10. The apparatus as in claim 9, wherein the multilayer board comprises a printed circuit board having metal layers.

11. The apparatus as in claim 10, wherein the metal layers include circuit components.

12. The apparatus as in claim 9, further comprising a transparent substrate, and one of the electrodes is formed on the transparent substrate.

13. The apparatus as in claim 9, wherein the printed circuit board comprises a resin layer.

14. The apparatus as in claim 10, wherein the metal layers comprises low-resistance metal.

15. The apparatus as in claim 10, wherein the metal layers include metal selected from the group consisting of: Cu, Cr, Ag, Au, Ni, and their alloy.

16. A method comprising:
   forming a first electrode on a transparent substrate;
   providing a second electrode opposite to the first electrode with respect to an electroluminescent light-emitting layer;
   providing a multilayer board attached to the first electrode and covering the electroluminescent light-emitting layer; and
   providing a hygroscopic agent attached to a bottom surface of the muitilayer board.

17. The method of claim 16, further comprising:
   providing the hygroscopic agent between the multilayer board and the second electrode.

18. The method of claim 17, further comprising:
   providing a sealant between the multilayer board and the first electrode.

19. An organic electroluminescent device comprising:
   a multilayer board;
   a hygroscopic agent attached to a bottom surface of the multilayer board; and
   means for producing electroluminescence, said multilayer board covering said means for producing electroluminescence.

20. The organic electroluminescent device as in claim 19, said multilayer board comprising circuit components provided on multiple layers of the multilayer board.

* * * * *